United States Patent [19]
Na

[11] Patent Number: 5,966,342
[45] Date of Patent: Oct. 12, 1999

[54] WRITE CONTROL DRIVER CIRCUIT AND METHOD

[75] Inventor: Joon-Ho Na, Cheongju, Rep. of Korea

[73] Assignee: LG Semicon Co., Ltd., Cheongju, Rep. of Korea

[21] Appl. No.: 09/060,998

[22] Filed: Apr. 16, 1998

[30] Foreign Application Priority Data

Oct. 10, 1997 [KR] Rep. of Korea ................. 97 51952

[51] Int. Cl.[6] .................................................. G11C 8/00
[52] U.S. Cl. ........................................................ 365/230.06
[58] Field of Search ............................. 365/233.5, 230.06

[56] References Cited

U.S. PATENT DOCUMENTS

| | | | |
|---|---|---|---|
| 4,744,063 | 5/1988 | Ohtani et al. ............................ | 365/233 |
| 5,267,216 | 11/1993 | Gabillard et al. .................... | 365/233.5 |
| 5,307,324 | 4/1994 | Nishimoto .............................. | 365/233.5 |
| 5,548,560 | 8/1996 | Stephens, Jr. et al. ............... | 365/233.5 |
| 5,740,123 | 4/1998 | Uchida .................................... | 365/233 |
| 5,825,693 | 10/1998 | Lee et al. ............................ | 365/189.05 |

*Primary Examiner*—David Nelms
*Assistant Examiner*—M. Tran
*Attorney, Agent, or Firm*—Fleshner & Kim

[57] ABSTRACT

A write control driver circuit stores a data in a high speed chip by causing an enabling timing of a write control signal to become faster. The circuit includes a first logic circuit for receiving a peri-top address transition detection signal and a peri-bottom address transition detection signal, and a second logic circuit for receiving a combined address transition detection signal, a coding signal and a write driver signal, each having a predetermined width. The combined address transition detection signal is generated based on a delay unit having a prescribed pulse width. The second logic circuit outputs a write control signal that is not controlled by the peri-top address transition detection signal and the peri-bottom address transition detection signal.

20 Claims, 4 Drawing Sheets

FIG. 2A BACKGROUND ART  ADD
FIG. 2B BACKGROUND ART  WE.CS
FIG. 2C BACKGROUND ART  WEZ
FIG. 2D BACKGROUND ART  ATDST
FIG. 2E BACKGROUND ART  ATDSB
FIG. 2F BACKGROUND ART  ATDS
FIG. 2G BACKGROUND ART  WC
FIG. 2H BACKGROUND ART  DATA/DATAB

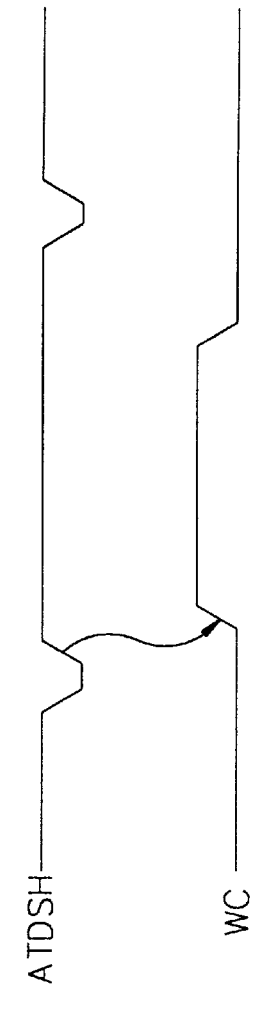
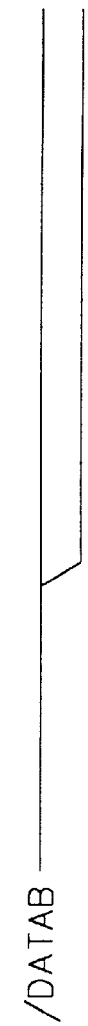
FIG. 4A  ADD
FIG. 4B  WE.CS
FIG. 4C  WEZ
FIG. 4D  ATDST
FIG. 4E  ATDSB
FIG. 4F  ATDSH
FIG. 4G  WC
FIG. 4H  DATA/DATAB

WRITE CONTROL DRIVER CIRCUIT AND METHOD

BACKGROUND OF THE INVENTION

1. Field of the Invention

The present invention relates to a semiconductor device and in particular, to a write control driver circuit for a high speed semiconductor device.

2. Background of the Related Art

FIG. 1 illustrates a related art write control driver circuit that includes a NAND-gate NAND 11 for receiving a peri-top address transition detection signal ATDST and a peri-bottom address transition detection signal ATDSB, respectively. An inverter IN11 inverts an output signal from the NAND11 to output an address transition detection signal ATDS. A NAND-gate NAND12 receives a write enable signal WE and a chip selection signal CS. An inverter IN12 inverts an output signal from the NAND-gate NAND12 to output a write driver signal WD. A NAND-gate NAND13 receives a coding signal WEZ, the write driver signal WD and the combined address transition detection signal ATDS. An inverter IN13 inverts an output signal from the NAND-gate NAND13 to output a write control signal WC to a data transmission unit DT.

The peri-top address transition detection signal ATDST is a signal that is obtained by adding the address transition detection signals at the peri-top, and the peri-bottom address transition detection signal ATDSB is a signal that is obtained by adding the address transition detection signals at a peri-bottom. The write control signal WC is used to control the write operation where data from a data input buffer (not shown) is written onto a cell. In other words, the write control signal WC is a signal for enabling the data transmission unit DT.

The operation of the related art write control driver circuit will now be described. First, as shown in FIGS. 2D–2E, the peri-top address transition detection signal ATDST and the peri-bottom address transition detection signal ATDSB are generated by an address signal ADD, which is shown in FIG. 2A. The peri-top address transition detection signal ATDST and the peri-bottom address transition signal ATDSB are NANDed by the NAND-gate NAND 11 and the result is inverted by the inverter IN11 to output the combined address transition detection signal ATDS. As shown in FIG. 2F, the pulse width of the combined address transition detection signal ATDS becomes wider than that of the individual peri-top address transition detection signal ATDST and the peri-bottom address transition detection signal ATDSB by a loading difference between the peri-top address transition detection signal ATDST and the peri-bottom address transition detection signal ATDSB.

In addition, the write enable signal WE and the chip selection signal CS are NANDed by the NAND-gate Nand12 and the result is inverted by the inverter In12 to output the write driver signal WD. The write driver signal WD, the combined address transition detection signal ATDS, and the coding signal WEZ are NANDed by the NAND-gate NAND 13, and the result is inverted by the inverter In13 to output the write control signal WC. The coding signal WEZ is preferably a signal output when the write enable signal WE and the signal from a Z-decoder (not shown) are combined by a NAND-gate (not shown).

When the write control signal WC is transited to a high level as shown in FIG. 2G, the data transmission unit DT is enabled and controlled by the write transmission transistor enable signal CWE. Accordingly, input data DATAIN from a data input buffer (not shown) is transmitted to and written into a cell as output data DATA and DATAB as shown in FIG. 2H.

Therefore, in the related art write control driver circuit, the write control signal WC is triggered when the combined address transition detection signal ATDS is transited to a high level. Since the pulse width of the combined address transition detection signal ATDS is wider than that of the two address transition detection signals ATDST and ATDSB, the write control signal WC is delayed by as much as the pulse width difference before being outputted. For example, assume that the pulse width of the two address transition detection signals ATDST and ATDSB is 4ns, and the peri-top address transition detection signal ATDST is delayed by 2ns (rather than the peri-bottom address transition detection signal ATDSB) and then is loaded. In this case, the pulse width of the combined address transition detection signal ATDS is increased to 6ns.

Therefore, in a high speed chip, it is becomes very difficult to accurately write the data onto the cells. For example, assuming that an AC parameter tAw is 12ns in an operational requirements specification of a 1M SRAM in the related art write control drive circuit, the signals are delayed by the combined address transition detection signal ATDS by 6ns, a cell loading by 5ns, and a write AC parameter margin tAs by 2ns, respectively. Accordingly, the total delay time becomes 13ns, which exceeds the write AC parameter tAw specification.

The above references are incorporated by reference herein where appropriate for appropriate teachings of additional or alternative details, features and/or technical background.

SUMMARY OF THE INVENTION

An object of the present invention is to provide a write control driver circuit that substantially overcomes at least the aforementioned problems encountered in the related art.

Another object of the present invention is to provide a write control driver circuit that performs faster enable timing of a write control signal.

A further object of the present invention is to provide a write control driver circuit that accurately stores data in a high speed semiconductor chip.

To achieve at least the above objects in a whole or in parts, there is provided a write control driver circuit according to the present invention that includes a first logic circuit for receiving a peri-top address transition detection signal and a peri-bottom address transition detection signal, and a second logic circuit for receiving a combined address transition detection signal, a coding signal and a write driver signal each having a predetermined width to output a write control signal.

To further achieve the above objects in a whole or in parts, there is provided a write control driver circuit according to the present invention that includes a first NAND-gate for receiving a peri-top address transition detection signal and a peri-bottom address transition detection signal, a delay circuit for delaying an output signal from the first NAND-gate, a second NAND-gate for receiving output signals from the delay circuit and the first NAND-gate and outputting a combined address transition detection signal, a third NAND-gate for receiving a write enable signal and a chip selection signal, a first inverter for inverting an output signal from the third NAND-gate to output a write driver signal, a fourth NAND-gate for receiving the combined address transition detection signal, the write driver signal and the coding signal, and a second inverter for inverting an output signal from the fourth NAND-gate to output a write control signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 2A–2H are diagrams showing operational timing of signals of FIG. 1;

FIGS. 4A–4H are diagrams operational timing of signals from the circuit of FIG. 3.

DETAILED DESCRIPTION OF PREFERRED EMBODIMENTS

Figure 1:
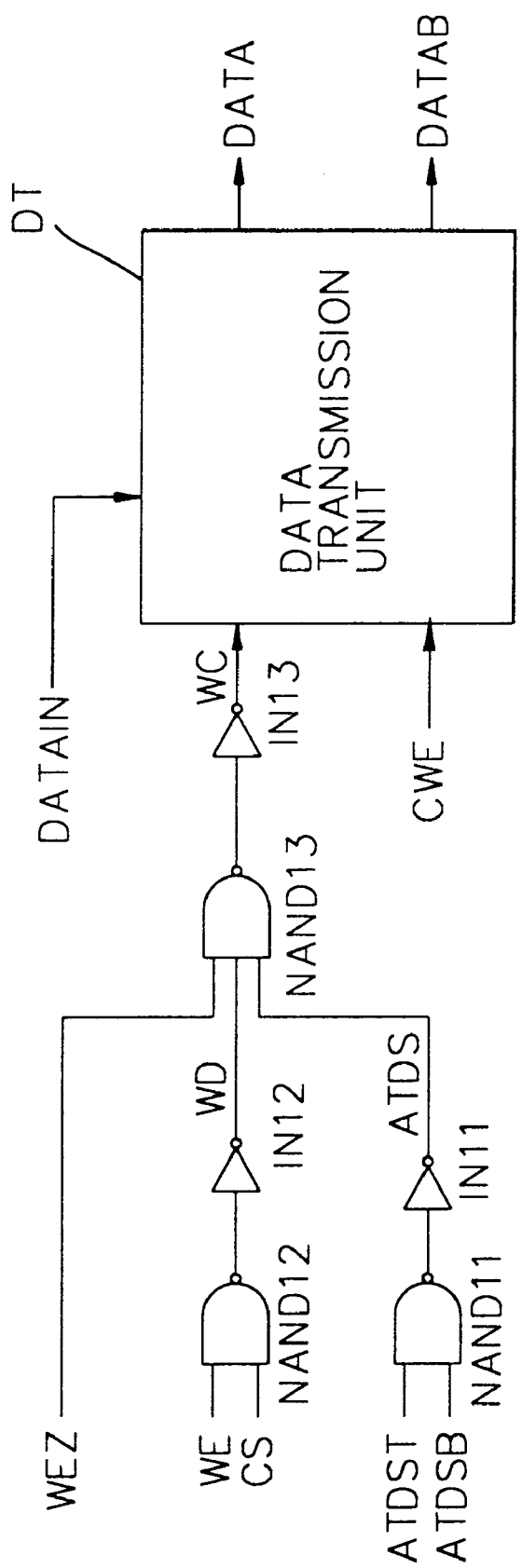
FIG. 1 is a circuit diagram illustrating a related art write control driver circuit.
Figure 3:
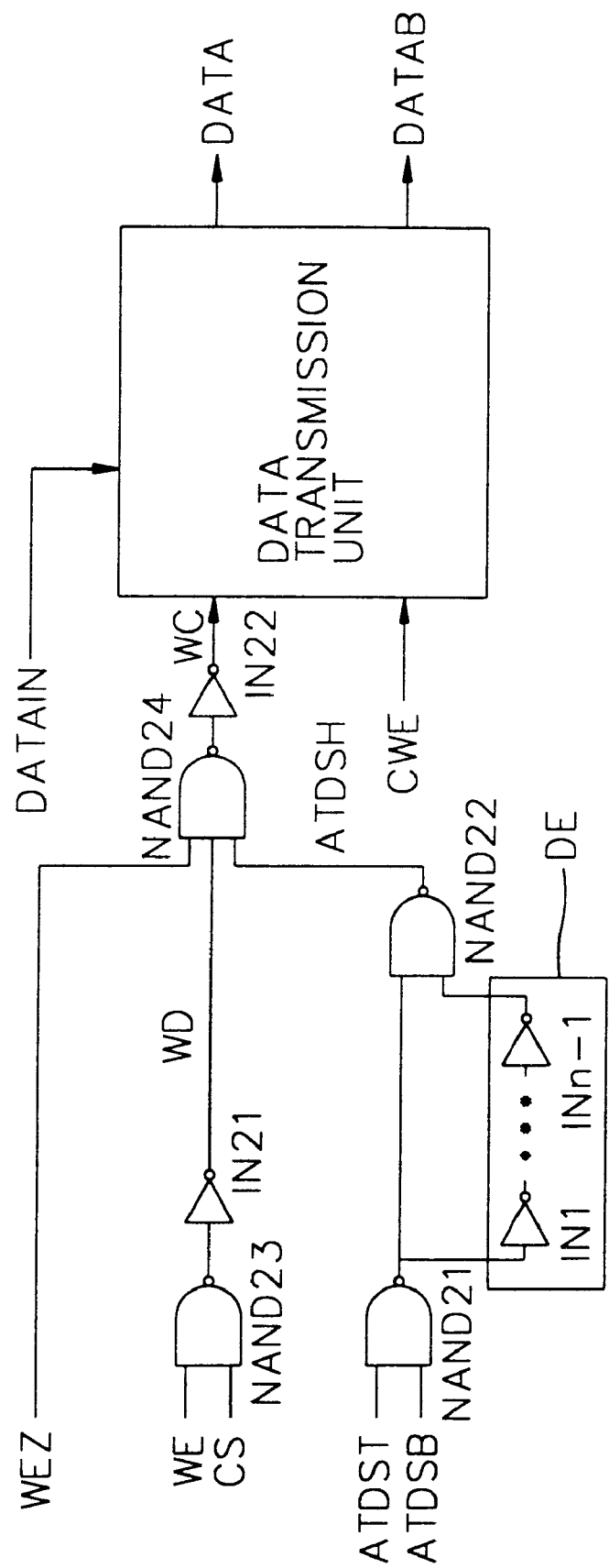
FIG. 3 is a diagram showing a write control driver circuit according to a preferred embodiment of the present invention.

As shown in FIG. 3, a preferred embodiment of a write control driver circuit according to the present invention includes a NAND-gate NAND21 for receiving a peri-top address transition detection signal ATDST and a peri-bottom address transition detection signal ATDSB and a delay circuit DE for delaying the output signal from the NAND-gate NAND21. A NAND-gate NAND22 receives output signals from the delay circuit DE and the NAND-gate NAND21 and outputs an address transition detection signal ATDSH. A NAND-gate NAND23 receives a write enable signal WE and a chip selection signal CS and an inverter IN21 inverts an output signal from the NAND-gate NAND23 to output a write driver signal WD. A NAND-gate NAND24 receives the address transition detection signal ATDSH, the write driver signal WD and a coding signal WEZ and an inverter IN22 inverts an output signal from the NAND-gate NAND24 to output a write control signal WC to the data transmission unit DT. As shown in FIG. 3, the delay circuit DE is preferably formed of a (2n+1) number of inverters IN1 through INn-1.

Operations of the preferred embodiment of the write control driver circuit according to the present invention will now be described. As shown in FIGS. 4D–4E, the peri-top address transition detection signal ATDST and the peri-bottom address transition detection signal ATDSB are NANDed by the NAND-gate NAND21 based on the address signal ADD shown in FIG. 4A. The output of the NAND-gate NAND21 is delayed by the delay circuit DE.

The output signals from the NAND-gate NAND21 and the delay circuit DE are NANDed by the NAND-gate NAND22 and outputted as the combined address transition detection signal ATDSH. Since the pulse width of the address transition detection signal ATDSH is determined based on the delay ratio of the delay circuit DE, a predetermined pulse width can be obtained for the address transition detection signal ATDSH.

The write enable signal WE and the chip selection signal CS are NANDed by the NAND-gate NAND23. The result is inverted by the inverter IN21 and outputted as the write drive signal WD. The write driver signal WD, the address transition detection signal ATDSH and a coding signal WEZ are NANDed by the NAND-gate NAND24, and the result is inverted by the inverter IN22 and outputted as the write control signal WC. The enabling timing of the write control signal WC is when the address transition detection signal ATDSH is transited to a high level.

Since the data transmission unit DT is controlled based on the write control signal WC and a write transistor enable signal CWE, the input data DATAIN from the data input buffer (not shown) are converted into output data DATA and DATAB and are transmitted to the cells to perform a write operation.

As described above, the preferred embodiment of the write control driver circuit according to the present invention has various advantages. The enabling timing of the write control signal is made faster by reducing the pulse width of the address transition detection signal using the delay circuit. Accordingly, data can be correctly transmitted even in a high speed semiconductor chip.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A write control driver circuit, comprising:
   a first logic circuit that receives a peri-top address transition detection signal and a peri-bottom address transition detection signal; and
   a second logic circuit that receives a combined address transition detection signal, a coding signal and a write driver signal each having a predetermined width, wherein the second logic current outputs a write control signal that is not controlled by the peri-top address transition detection signal and the peri-bottom address transition detection signal.

2. The circuit of claim 1, wherein said first logic circuit includes:
   a first NAND-gate that receives the peri-top address transition detection signal and the peri-bottom address transition detection signal;
   a delay circuit that receives an output signal from the first NAND-gate; and
   a second NAND-gate that receives output signals from the first NAND-gate and the delay circuit and outputs the combined address transition detection signal.

3. The circuit of claim 1, wherein a pulse width of the combined address transition detection signal is determined by a delay circuit of the first logic circuit.

4. The circuit of claim 3, wherein said delay circuit is comprised of a plurality of series coupled inverters and generates a prescribed delay ratio.

5. The circuit of claim 4, wherein said delay circuit comprises 2n +1 inverters.

6. The circuit of claim 1, further comprising a third logic circuit that receives the write enable signal and an output signal from a Z-decoder to output the coding signal.

7. The circuit of claim 1, further comprising a third logic circuit that receives a write enable signal and a chip selection signal and outputs the write driver signal.

8. The circuit of claim 7, wherein said third logic circuit includes:
   a first logic-gate that receives the write enable signal and a chip selection signal; and an inverter that inverts an output signal from the first logic-gate.

9. The circuit of claim 1, wherein said second logic circuit comprises:
   a first logic-gate that receives the combined address transition detection signal, the coding signal and the write driver signal; and
   an inverter that inverts an output signal from the first logic-gate.

10. The circuit of claim 1, wherein said peri-top address transition detection signal and said peri-bottom address transition detection signal are respectively signals generated by combining the address transition detection signals at the peri-top and by combining the address transition detection signals at the peri-bottom.

11. The circuit of claim 1, further comprising a data transmission unit that is enabled by the write control signal.

12. The circuit of claim 11, wherein said data transmission unit is controlled by a write transmission transistor enable signal to write data from a data input buffer onto a cell.

13. A write control driver circuit, comprising:
   a first logic-gate that receives a first address transition detection signal and a second address transition detection signal;
   a delay circuit that delays an output signal from the first logic-gate;
   a second logic-gate that receives output signals from the delay circuit and the first logic-gate and outputs a combined address transition detection signal; and
   a logic circuit that receives the combined address transition detection signal, a first signal and a second signal, and outputs a write control signal.

14. The circuit of claim 13, further comprising:
   a third logic-gate that receives a write enable signal and chip selection signal; and
   a first inverter that inverts an output signal from the third logic-gate and outputs a write driver signal, wherein the first signal is the write driver signal and the second signal is a coding signal.

15. The circuit of claim 14, wherein the logic circuit comprises:
   a fourth logic-gate; and
   a second inverter that inverts an output signal from the fourth logic-gate and outputs the write control signal.

16. The circuit of claim 15, wherein said delay circuit comprises an odd number of series coupled inverters, and wherein the first through fourth logic-gates are NAND-gates.

17. The circuit of claim 13, wherein a pulse width of the combined address transition detection signal is determined by a delay ratio of the delay circuit.

18. The circuit of claim 13, wherein the first address transition detection signal is a peri-top address transition detection signal and the second address transition detection signal is a peri-bottom address transition detection signal.

19. A method of operating a write control driver circuit, comprising:
   logically processing first and second address transition detection signals to generate a first signal;
   delaying the first signal;
   logically processing the delayed first signal and the first signal to output a combined address transition detection signal;
   logically processing a write enable signal and chip selection signal to generate a write driver signal;
   logically processing the combined address transition detection signal, the write driver signal and a coding signal to output a write control signal that is not controlled by the first and second address transition detection signals.

20. The method of claim 19, wherein a pulse width of the combined address transition detection signal is determined by the delaying step.

* * * * *